United States Patent [19]

Kimura et al.

[11] Patent Number: 5,665,616

[45] Date of Patent: Sep. 9, 1997

[54] PROCESS OF MANUFACTURING A SEMICONDUCTOR DEVICE

[75] Inventors: Koji Kimura, Chigasaki; Hiroshi Naruse, Yokohama, both of Japan

[73] Assignee: Kabushiki Kaisha Toshiba, Kawasaki, Japan

[21] Appl. No.: 731,012

[22] Filed: Oct. 9, 1996

[30] Foreign Application Priority Data

Oct. 10, 1995 [JP] Japan ................... 7-289392

[51] Int. Cl.[6] .................................. H01L 21/265
[52] U.S. Cl. ............................ 438/234; 438/300
[58] Field of Search ..................... 437/31, 34, 59, 437/162, 89, 90, 91; 148/DIG. 9

[56] References Cited

U.S. PATENT DOCUMENTS

| | | | |
|---|---|---|---|
| 4,778,774 | 10/1988 | Blossfeld | 437/59 |
| 4,892,837 | 1/1990 | Kudo | 437/31 |
| 4,902,640 | 2/1990 | Sachitano et al. | 437/31 |
| 5,100,815 | 3/1992 | Tsubone et al. | 437/34 |
| 5,244,533 | 9/1993 | Kimura et al. | 437/31 |
| 5,296,391 | 3/1994 | Sato et al. | 437/31 |

*Primary Examiner*—Tuan H. Nguyen
*Attorney, Agent, or Firm*—Finnegan, Henderson, Farabow, Garrett & Dunner, L.L.P.

[57] ABSTRACT

In the Bi-CMOS process of manufacturing a semiconductor device by an effective combination of a bipolar transistor manufacturing process and a CMOS transistor manufacturing process in the case of the formation of a silicide film on a Bi-CMOS device, in which the bipolar transistor having an inner base region made of a silicon film grown by epitaxy and the MOS transistor having silicide formed on the gate electrode, source region and drain region in a self-aligned manner therewith are formed on the same semiconductor substrate, while the silicon film of the inner base region is epitaxially grown in a step, a silicon film is also epitaxially grown on the source/drain regions at the same time in the same step.

6 Claims, 7 Drawing Sheets

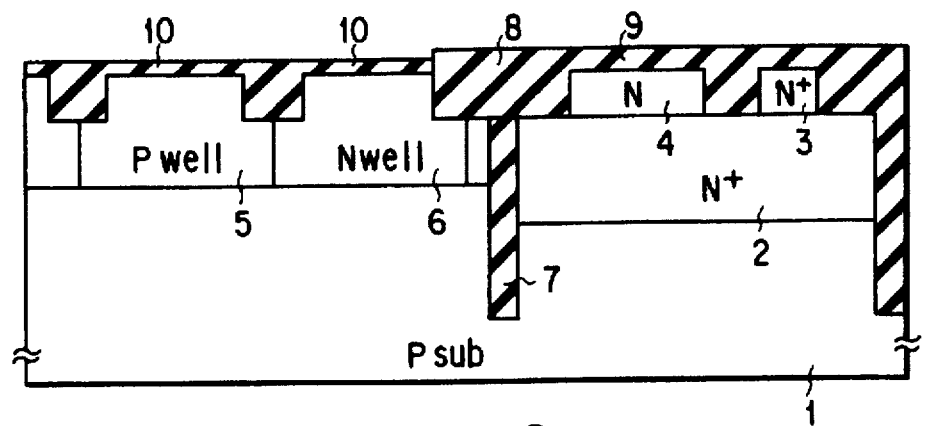
F I G. 6
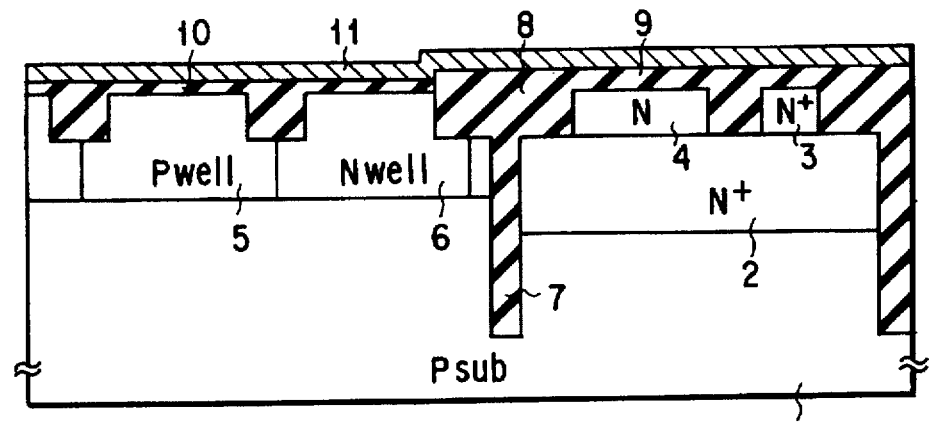
F I G. 7
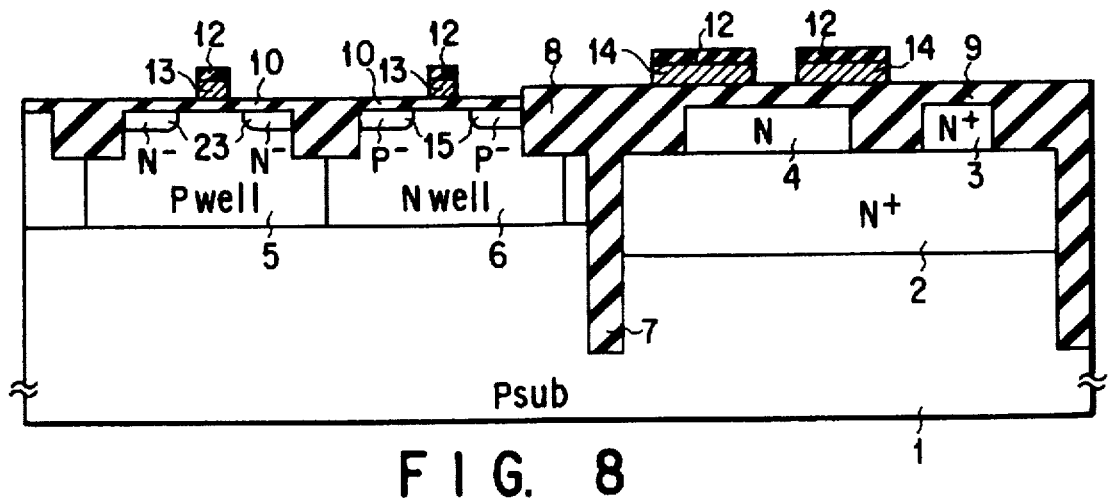
F I G. 8

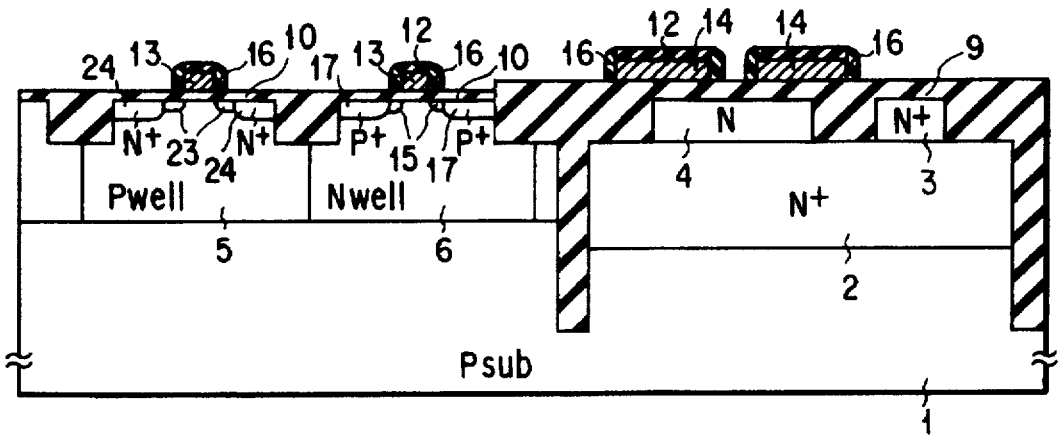
F I G. 9
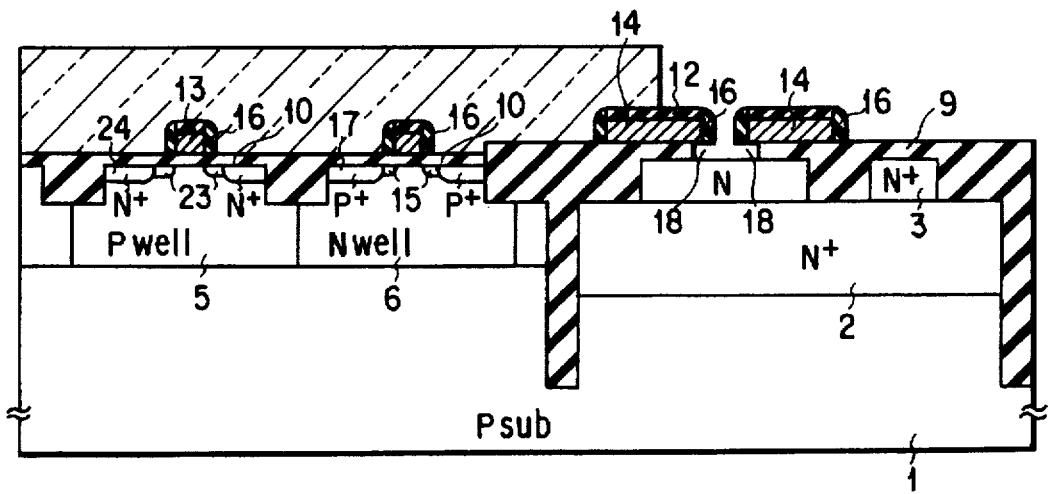
F I G. 10
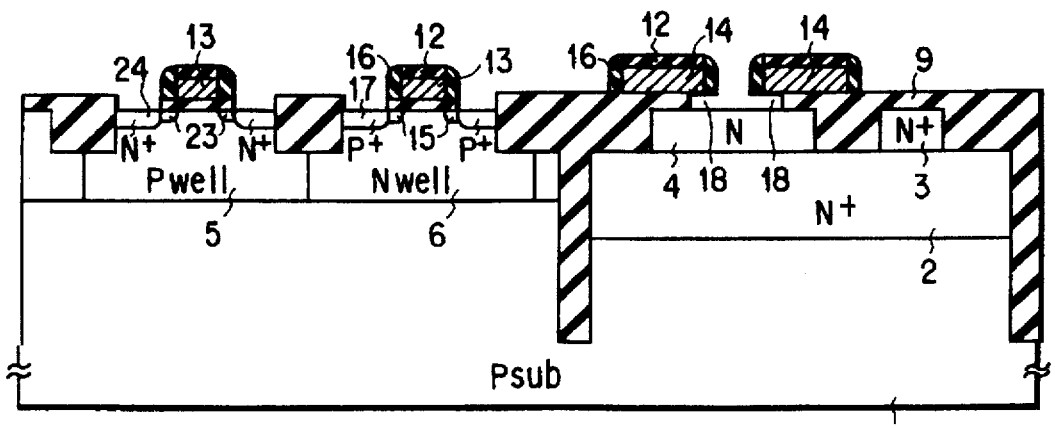
F I G. 11

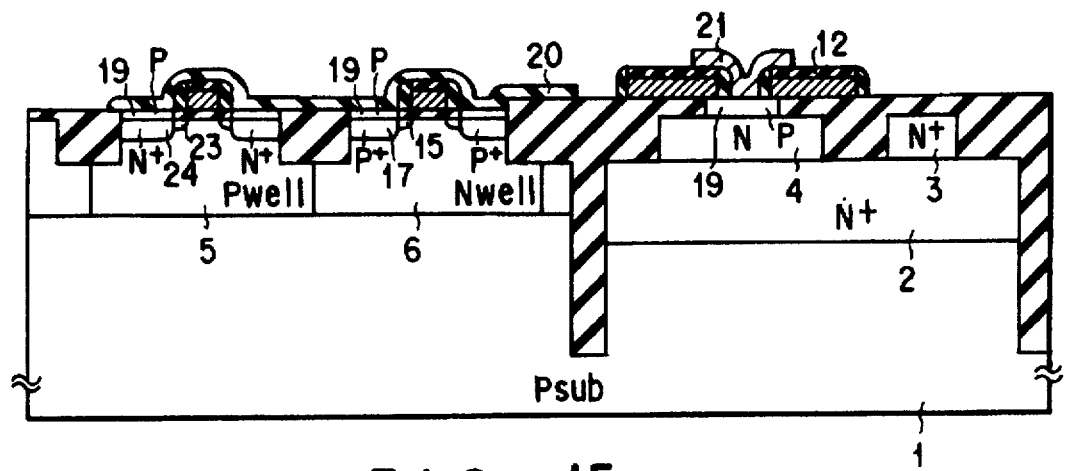
F I G. 15
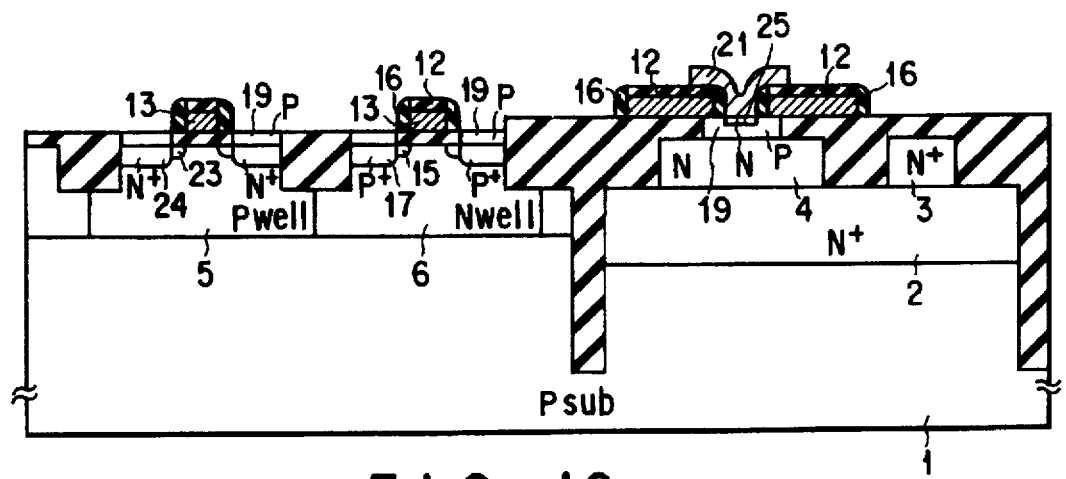
F I G. 16
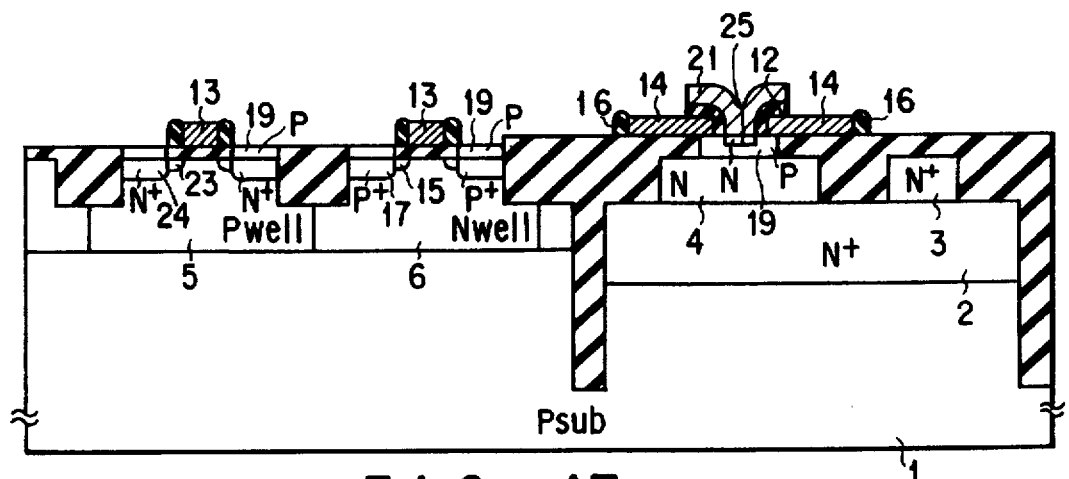
F I G. 17

PROCESS OF MANUFACTURING A SEMICONDUCTOR DEVICE

BACKGROUND OF THE INVENTION

1. Field of the Invention

The present invention relates to a process of manufacturing a semiconductor device in which a highly integrated, microstructured CMOS transistor and a bipolar transistor having high driving and high speed performance are formed on a single semiconductor substrate. Particularly, the present invention relates to a process of manufacturing a Bi-CMOS device, utilizing a simple combination of a bipolar transistor manufacturing process and a MOS transistor manufacturing process.

2. Description of the Related Art

The more the CMOS transistor is miniaturized, the thinner the impurity diffusion regions constituting a source/drain regions become to suppress a short-channel effect. As a result, the sheet resistance of the source/drain regions increases and driving performance thereby deteriorates. To prevent this, a technique called a self-aligned silicide technique has been developed. The technique is to provide titanium silicide (TiSi), molybdenum silicide (MoSi), tungsten silicide (WSi) or the like on the source and drain in a self-aligned manner. To be more specific, a metal film made of, for example, Ti, Mo, W is formed on a semiconductor substrate and only a part of the metal film which is provided on the silicon layer on the semiconductor substrate is made into silicide.

Meanwhile, the growth speed of the titanium silicide or the like is slow on an N-type silicon and fast on a P-type silicon. Due to this, during an ordinary CMOS process, silicide formed on the source/drain regions of an NMOS transistor becomes thinner than that formed on the source/drain regions of a PMOS transistor. As the film is thinner, the sheet resistance of the titanium silicide increases and heat resistance thereof decreases, with the result that agglomeration tends to easily occur on the NMOS transistor at the time of heat treatment in the later step. On the other hand, if silicide is made thick, it is put close to the junction of the source/drain regions of the PMOS transistor and therefore junction leak tends to easily occur through the source/drain regions. The agglomeration of the silicide on the NMOS transistor and the junction leak on the source/drain regions of the PMOS transistor, thus, are in trade-off and affect the application of the self-aligned silicide technique to a CMOS transistor device.

To overcome the above-mentioned problem, a technique called a raised source and drain process or an elevated source and drain process has been developed. In this process, a silicon film having a low impurity concentration and a predetermined thickness has been previously deposited by epitaxy on source/drain regions so that only the film is used for silicide. Thereafter, self-aligned silicide process is carried out.

As mentioned above, if the elevated source and drain process is applied, only a silicon film formed on the source/drain regions in advance is used for the self-aligned silicide process and the source/drain regions are not influenced by the process, thereby preventing junction leak through the source/drain regions. According to the self-aligned silicide process utilizing the above technique, a series of steps of growing a silicon film by epitaxy, depositing metal thereon and silicifying the metal with the silicon are carried out to thereby form a silicide film in the final stage of the formation of a transistor. That is, after the formation of source/drain regions and a gate region, a silicide film is formed by a series of these steps.

If the CMOS transistor formed by the above process and a high speed bipolar transistor formed by a known double-layer polysilicon self-alignment process are fabricated on a single semiconductor substrate, short circuit tends to occur between a base electrode and an emitter electrode of the bipolar transistor. The reason is as follows. In a semiconductor device of this type, a silicon film is grown on the base electrode and the emitter electrode of a bipolar transistor by epitaxy before silicifying the surface regions of the electrodes with the silicon film. During the growth, short circuit tends to occur between the electrodes. This makes it necessary to separate the self-aligned silicide step of a CMOS transistor from that of a bipolar transistor, resulting in a lengthy process.

The present invention has been made to solve these disadvantages. Its object is to provide a process of manufacturing a semiconductor device utilizing a combination of a bipolar transistor manufacturing process and a MOS transistor manufacturing process wherein a silicide film is effectively formed on a semiconductor substrate having a CMOS transistor and a bipolar transistor formed thereon.

SUMMARY OF THE INVENTION

The present invention is characterized in that, in the Bi-CMOS process by which the bipolar transistor having an inner base region made of a silicon film grown by epitaxy and the MOS transistor having silicide formed on the gate electrode, source region and drain region in a self-aligned manner are formed on the same semiconductor substrate, while the silicon film of the inner base region is epitaxially grown, a silicon film epitaxially is also grown on the source/drain regions and at the same time in the same step. The process of manufacturing a semiconductor device according to the present invention is characterized by comprising the steps of: forming a first insulating film in a bipolar transistor formation region of a main surface of a silicon semiconductor substrate; forming a second insulating film constituting a gate oxide film in a MOS transistor formation region on the main surface of the silicon semiconductor substrate; forming a silicon gate electrode on the gate oxide film of the MOS transistor formation region; forming a base electrode made of silicon on the first insulating film in the bipolar transistor formation region; coating a side wall and an upper surface of the gate electrode and base electrode with a third insulating film; forming source/drain regions in the MOS transistor formation region; removing a portion of the first insulating film which is in an emitter region and contacts the lower surface of the base electrode, thereby exposing a portion of the main surface of the semiconductor substrate facing the removed region; epitaxially growing a silicon film on the exposed portion on the main surface of the semiconductor substrate and on the source/drain regions, thereby making the silicon film of the exposed portion on the main surface of the semiconductor substrate serving as a base region; forming an emitter region by diffusing impurities into the base region; forming a silicon emitter electrode on the emitter region; depositing a metal layer on the source/drain regions, gate electrode, base electrode and emitter electrode; and forming metal silicide in a self-aligned manner with the source/drain regions, gate electrode, base electrode and emitter electrode, by thermal heating the metal layer to react the heated metal layer with silicon of the source/drain regions, gate electrode, base electrode and emitter electrode.

The present invention is characterized in that, during the above process, the first insulating layer differs from the third insulating film in etching rate. The present invention is characterized in that, during the above process, the gate electrode, base electrode and emitter electrode are made of polysilicon. The present invention is characterized in that, during the above process, the gate electrode formation and the base electrode formation are carried out in the same step. The present invention is characterized in that, during the above process, the first insulating film is made of a silicon oxide film and the third insulating film is made of silicon nitride. The present invention is characterized in that, during the above process of the step of removing the region of the first insulating film, the region of the first insulating film is etched away by isotropic etching and part of the base electrode on the removed region is overhung.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a cross-sectional view of a semiconductor device structure in a manufacturing step of the semiconductor device of the present invention shown in FIGS. 1 and 2;

FIG. 7 is a cross-sectional view of a semiconductor device structure an a manufacturing step of the semiconductor device of the present invention shown in FIGS. 1 and 2;

FIG. 8 is a cross-sectional view of a semiconductor device structure an a manufacturing step of the semiconductor device of the present invention shown in FIGS. 1 and 2;

FIG. 9 is a cross-sectional view of a semiconductor device structure an a manufacturing step of the semiconductor device of the present invention shown in FIGS. 1 and 2;

FIG. 10 is a cross-sectional view of a semiconductor device structure an a manufacturing step of the semiconductor device of the present invention shown in FIGS. 1 and 2;

FIG. 11 is a cross-sectional view of a semiconductor device structure in a manufacturing step of the semiconductor device of the present invention shown in FIGS. 1 and 2;

FIG. 15 is a cross-sectional view of a semiconductor device structure in a manufacturing step of the semiconductor device of the present invention shown in FIGS. 1 and 2;

FIG. 16 is a cross-sectional view of a semiconductor device structure in a manufacturing step of semiconductor device of the present invention shown in FIGS. 1 and 2;

FIG. 17 is a cross-sectional view of a semiconductor device structure in a manufacturing step of the semiconductor device of the present invention shown in FIGS. 1 and 2;

DETAILED DESCRIPTION OF THE PREFERRED EMBODIMENTS

Embodiments of the present invention will now be described, referring to the appended drawings.

Figure 1:
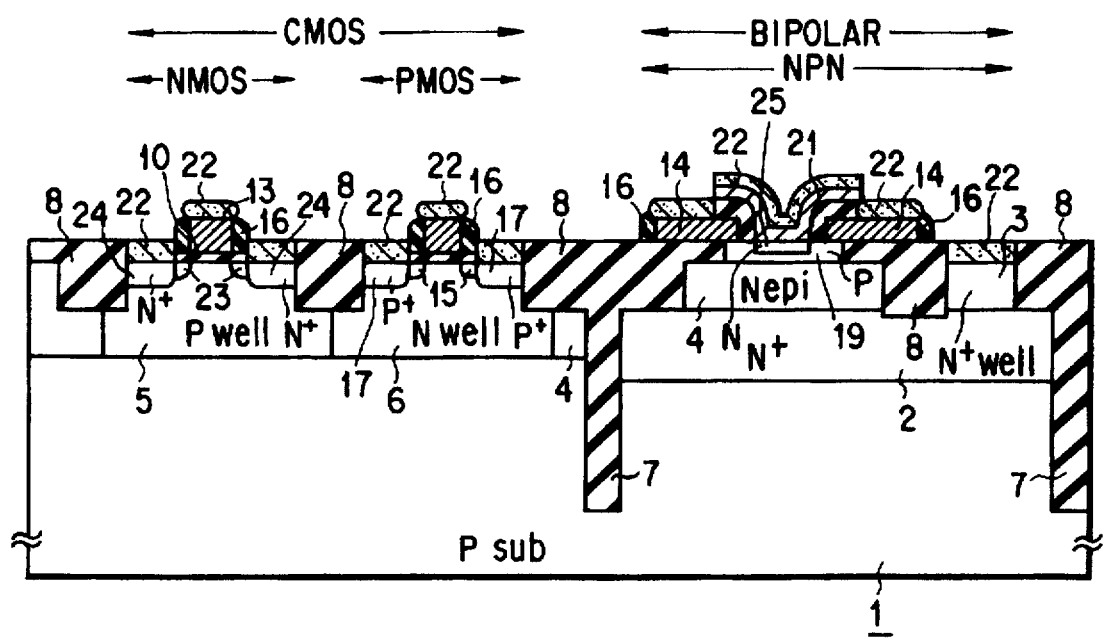
FIG. 1 is a cross-sectional view of a semiconductor device according to a first embodiment of the present invention.
Figure 2:
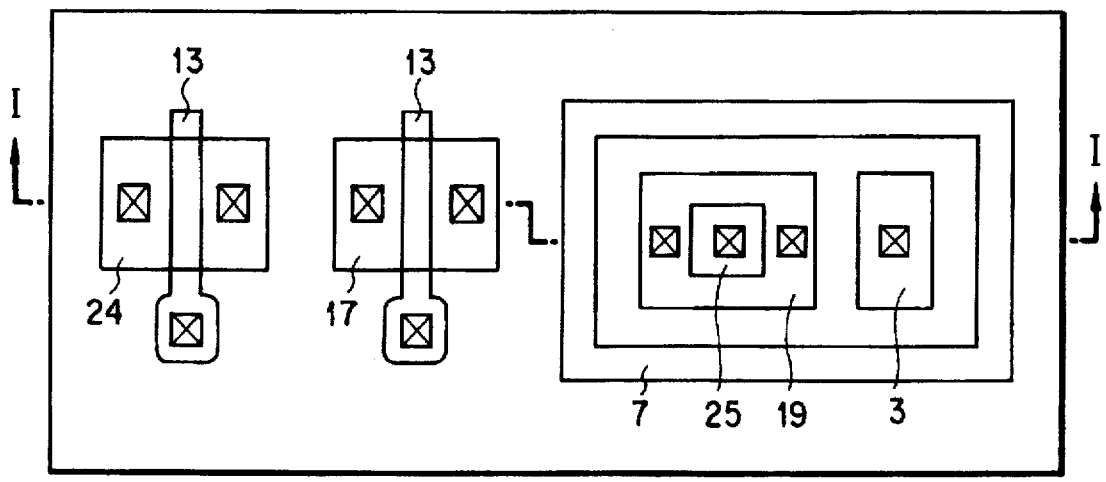
FIG. 2 is a plan view of the semiconductor device of the present invention shown in FIG. 1.

A semiconductor device will be described with reference to FIGS. 1 and 2. FIG. 1 illustrates a Bi-CMOS device wherein a CMOS transistor part forming an NMOS transistor and a PMOS transistor and a bipolar transistor part forming a bipolar transistor are provided on a P-type silicon semiconductor substrate. FIG. 1 is a cross-sectional view of the semiconductor device. FIG. 2 is a plan view of the semiconductor device. The cross-sectional view of FIG. 1 illustrates a portion taken along line I—I of FIG. 2. An epitaxial wafer comprising a P-type silicon semiconductor substrate 1 and an N-type silicon epitaxial layer (or first layer) grown on the substrate 1 is used as a semiconductor substrate. An $N^+$ buried layer 2 is formed, in the bipolar transistor part, between the P-type silicon substrate 1 and the N-type silicon epitaxial layer 4. The $N^+$ buried layer 2 contacts a collector leading $N^+$ well 3 the surface of which is exposed to the main surface of the semiconductor substrate. The $N^+$ buried layer 2 also contacts the N-type silicon epitaxial layer 4 in the bipolar transistor part, on which a P-type silicon epitaxial layer 19 is formed. The layer 19 constitutes a base region. An N-type ion-doped layer constituting an emitter region 25 is formed on the surface of the base region.

The bipolar part is surrounded by an element-separating deep trench isolation 7 (DTI). A shallow trench isolation 8 (STI) is used for separating respective regions of the NPN bipolar transistor such as a base region and a collector region. A base electrode 14 made of polysilicon is formed on the main surface of the semiconductor substrate. The side wall of the base electrode 14 is isolated and protected by a spacer 16 made of a silicon nitride ($Si_3N_4$) film. The surface of the electrode 14 is partly isolated and protected by the silicon nitride film, as well. An emitter electrode 21 made of polysilicon is formed on the emitter region 25.

In the CMOS transistor part, meanwhile, an NMOS transistor is formed in a P well 5 provided in the N-type epitaxial layer 4. A PMOS transistor is formed in an N well 6 provided in the N-type epitaxial layer 4. These well regions 5 and 6 of the CMOS transistor part are separated by the STI film 8. The NMOS transistor formed in the P well 5 is provided with N⁺ source/drain regions 24 and lightly doped drain (LDD) regions 23. A gate 13 made of polysilicon is formed between the source/drain regions 24 via a gate oxide film 10 on the main surface of the semiconductor substrate 1. A spacer 16 made of a silicon nitride ($Si_3N_4$) film is provided on the side wall of the gate.

The PMOS transistor formed in the N well 6 is provided with P⁺ source/drain regions 17 and LDD regions 15. A gate 13 made of polysilicon is formed between the source/drain regions 17 via a gate oxide film 10 on the main surface of the semiconductor substrate 1. A spacer 16 made of silicon nitride ($Si_3N_4$) film is provided on the side wall of the gate.

Silicide films 22 made of, for example, Ti are formed on the source/drain regions and gate of the CMOS part and the base electrode, collector leading N⁺ well and emitter electrode of the bipolar part, respectively, for the purpose of decreasing resistance.

Element separation means are not restricted to the DTI separation and the STI separation. Such methods are available to separate a bipolar transistor part by means of the DTI separation and a CMOS transistor part by means of LOCal Oxidation of Silicon (LOCOS), or to separate both the CMOS transistor part and the bipolar transistor part by means of the LOCOS separation. The DTI separation and the STI separation are suitable for high-speed devices such as an SRAM and a logic device.

Now, a process of manufacturing a semiconductor device will be described, referring to FIGS. 3 to 18.

First, a semiconductor substrate is provided wherein an N-type epitaxial layer 4 is formed on a P-type silicon semiconductor substrate 1 and a buried layer for a bipolar transistor is formed between the P-type silicon semiconductor substrate and the N-type epitaxial layer 4.

Figure 3:
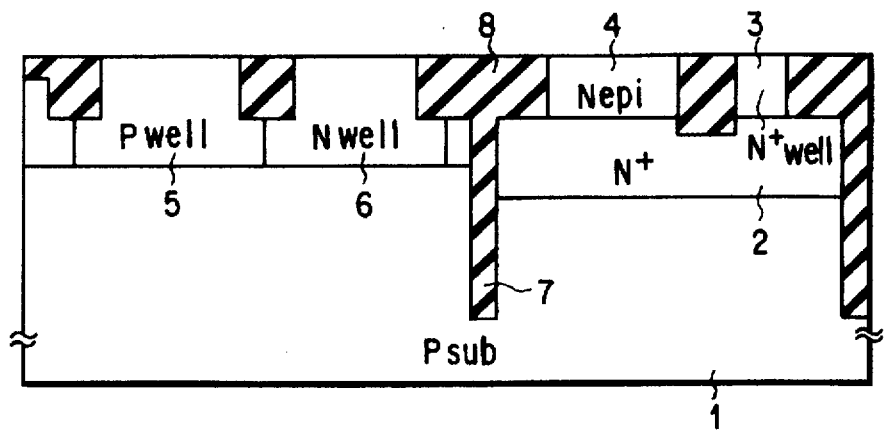
FIG. 3 is a cross-sectional view of a semiconductor device structure in a manufacturing step of the semiconductor device of the present invention shown in FIGS. 1 and 2.
Figure 4:
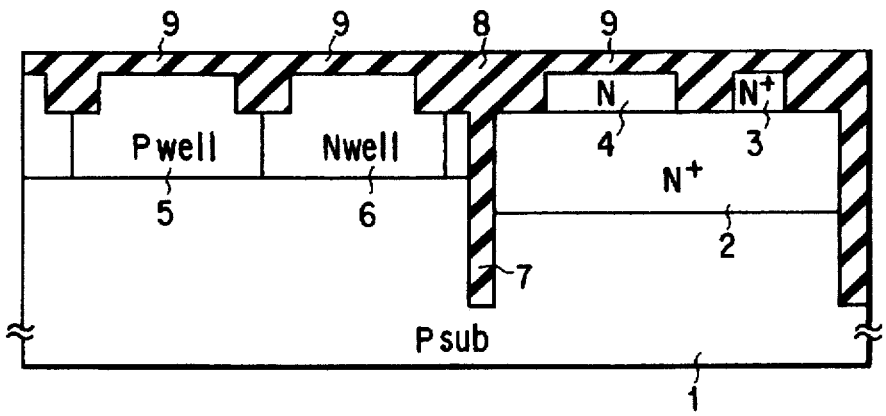
FIG. 4 is a cross-sectional view of a semiconductor device structure in a manufacturing step of the semiconductor device of the present invention shown in FIGS. 1 and 2.
Figure 5:
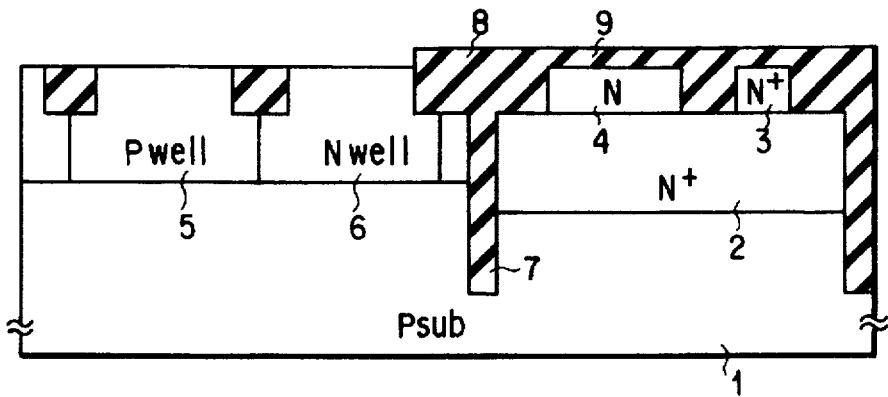
FIG. 5 is a cross-sectional view of a semiconductor device structure in a manufacturing step of the semiconductor device of the present invention shown in FIGS. 1 and 2.

A collector leading N⁺ well 3, a P well in which an NMOS transistor is formed, an N well 6 in which a PMOS transistor is formed and DTI film 7 and STI film 8 for element separation are provided on the N-type epitaxial layer 4 by a known BI-CMOS device manufacturing process (FIG. 3). A first insulating film, that is, silicon oxide (SiO2) film 9 of about 30 nm is formed on the semiconductor substrate by thermal oxidation (FIG. 4). While the bipolar transistor part is covered with a mask (not shown), the first silicon oxide film 9 of the CMOS transistor part is etched away to thereby expose the surface of the semiconductor substrate of the CMOS transistor part (FIG. 5).

A gate oxide 10 having a thickness of about 6 nm serving as a second insulating layer is thermal oxidation formed on the exposed surface portion of the semiconductor substrate of the CMOS transistor part (FIG. 6). A polysilicon film 11 having a thickness of about 300 nm is formed on the main surface of the semiconductor substrate by, for example, chemical vapor deposition (CVD). The bipolar transistor part is masked with photoresist (not shown) while the polysilicon film 11 of the CMOS transistor part is doped with arsenic by ion implantation under the conditions of an acceleration voltage of 40 KV and a dose amount of $10 \times 10^{16}$ cm⁻². The CMOS transistor part is masked with photoresist (not shown) and the polysilicon film 11 of the bipolar transistor part is doped with boron by ion implantation under the conditions of an acceleration voltage of 40 KV and a dose amount of $10 \times 10^{16}$ cm⁻². It is also possible to dope the PMOS transistor with boron in the same way as the bipolar transistor part to improve CMOS transistor characteristics (FIG. 7).

Next, a first silicon nitride ($Si_3N_4$) film 12 having a thickness of about 100 nm is formed on the polysilicon film 11 by CVD. The polysilicon film 11 and the silicon nitride film 12 formed thereon are partly etched to thereby form a gate 13 of the CMOS transistor part and the base electrode 14 of the bipolar transistor part. In this case, anisotropic etching such as reactive ion etching (RIE) is used. Since the gate and base electrode are formed out of the same polysilicon layer, the patterning step can be common to the CMOS part and the bipolar part. While photoresist (not shown) is used as a mask, LDD regions are formed on the N-type epitaxial layer 4 of the semiconductor substrate. That is, the NMOS transistor is doped with phosphor and the PMOS transistor with boron under respectively appropriate conditions by ion implantation. Thus, an LDD region 15 is formed on the PMOS transistor and an LDD region 23 is formed on the NMOS transistor (FIG. 8).

After a silicon nitride film having a thickness of 300 nm is formed entirely on the main surface of the semiconductor substrate by CVD, anisotropic etching such as RIE is carried out to form a spacer 16 made of a silicon nitride (Si3N4) film on each of the side walls of the gate 13 and base electrode 14. The silicon nitride films 12 and 16 constitute a third insulating film. While photoresist (not shown) is used as a mask, the NMOS transistor is doped with arsenic under the conditions of an acceleration voltage of 40 KV and a dose amount of $5 \times 10^{15}$ cm⁻² by ion implantation. The PMOS transistor is doped with $BF_2$ under the conditions of an acceleration voltage of 40 KV and a dose amount of $5 \times 10^{15}$ cm⁻² by ion implantation. Thus, the source/drain regions 17 and 24 are formed on the PMOS transistor and the NMOS transistor, respectively (FIG. 9). Then, while the CMOS transistor part is masked with photoresist, the exposed portion of the first silicon oxide film (or first insulating film) 9 is etched by buffered hydrofluoric acid to form an overhung portion 18 by the base electrode 14 and the silicon nitride film 16 (FIG. 10) and to expose a portion of the N-type silicon layer 4 in the bipolar transistor part.

After the photoresist is removed, the gate oxide film 10 on the source/drain regions of the CMOS transistor part is etched away by buffered hydrofluoric acid (FIG. 11) to expose the silicon portions corresponding to the source/drain regions of the CMOS transistors.

Figure 12:
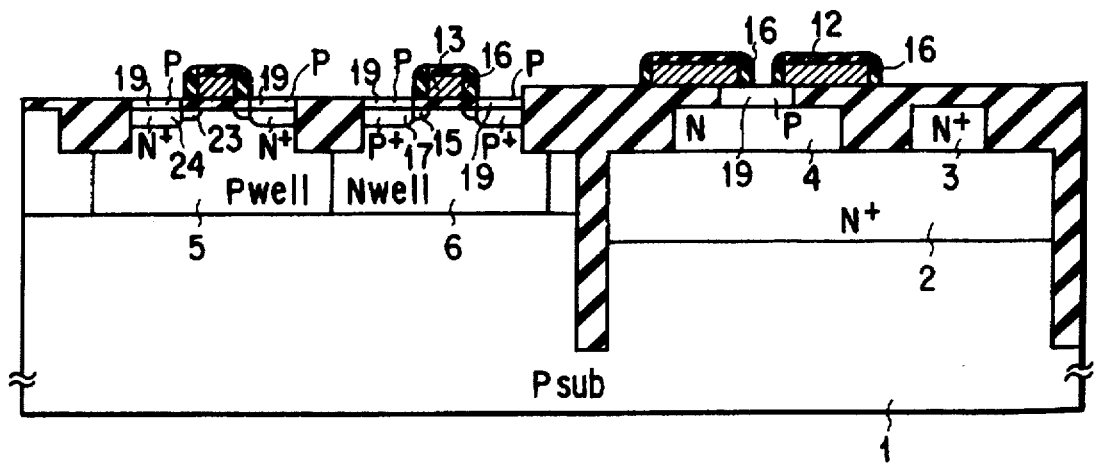
FIG. 12 is a cross-sectional view of a semiconductor device structure in a manufacturing step of the semiconductor device of the present invention shown in FIGS. 1 and 2.

Thereafter, P-type silicon epitaxial films 19 having a boron concentration of $5 \times 10^{18}$ cm⁻³ are formed only on the exposed silicon portions by CVD. The P-type silicon epitaxial films 19 have a depth of about 50 nm from the main surface of the semiconductor substrate. The silicon epitaxial film 19 formed on the exposed silicon portion 4 in the bipolar transistor part serves as an inner base region of the bipolar transistor, while the silicon epitaxial films 19 formed on the surface of the source/drain regions of the CMOS transistor part are to be made into silicide layers with metal in a later step. In this case, the impurity concentration of the P-type silicon epitaxial film must be determined in accordance with the conditions of the formation of the inner base region. However, the formation of silicide out of the silicon epitaxial film 19 is substantially influenced by the conditions of thermal treatment and thus the impurity concentration of the P-type epitaxial film is not highly regarded in this case (FIG. 12).

Figure 13:
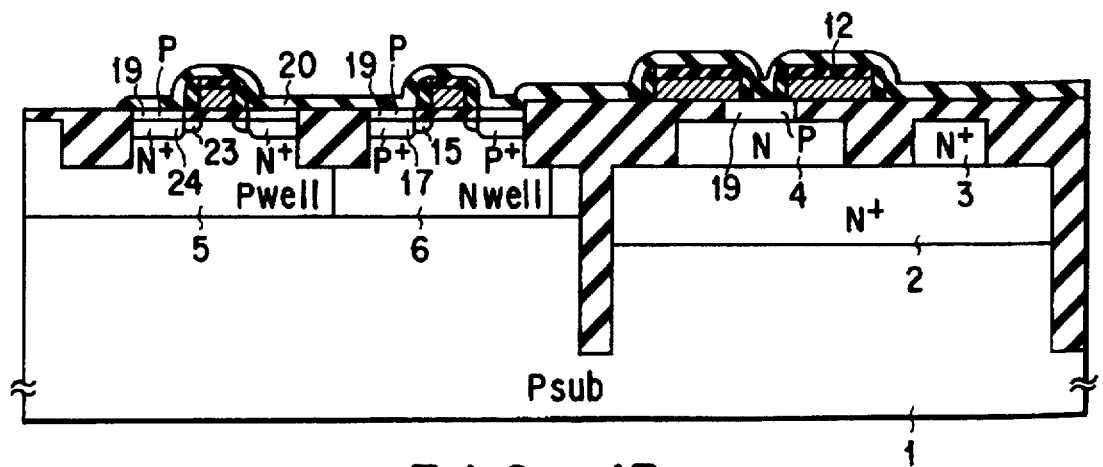
FIG. 13 is a cross-sectional view of a semiconductor device structure an a manufacturing step of the semiconductor device of the present invention shown in FIGS. 1 and 2.
Figure 14:
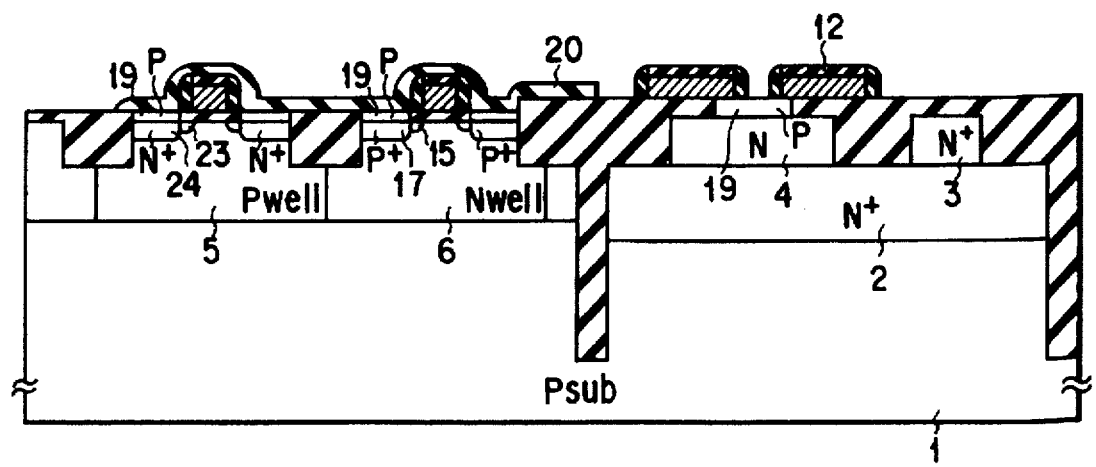
FIG. 14 is a cross-sectional view of a semiconductor device structure in a manufacturing step of the semiconductor device of the present invention shown in FIGS. 1 and 2.

A silicon oxide film 20 having a thickness of about 100 nm is formed on both the CMOS transistor part and the bipolar transistor part on the main surface of the semiconductor substrate by CVD. As a result, the P-type silicon epitaxial film 19 of the source/drain regions are coated with and therefore protected by the silicon oxide film 20 (FIG. 13). Next, using photoresist (not shown) as a mask, the silicon oxide film 20 formed on the bipolar transistor part is etched away using etchant such as NH₄F+HF (FIG. 14). A polysilicon film having a concentration of about $1\times10^{20}$ cm$^{-3}$ of arsenic ion is formed on the main surface of the semiconductor substrate, and a portion of the polysilicon film which is on a region other than the emitter region is etched away, while using photoresist (not shown) as a mask.

The polysilicon film remaining on the P-type silicon epitaxial film 19 is used as an emitter electrode 21 (FIG. 15).

Thermal treatment is carried out on the semiconductor substrate at 1000° C. for 20 seconds by RTA (Rapid Thermal Anneal), thereby activating emitter impurities. As a result, the emitter impurities contained in the emitter electrode 21 are diffused into the P-type silicon epitaxial film 19 from the surface of the film 19, thereby forming an N-type emitter region 25 in the surface region of the silicon epitaxial film 19. The silicon oxide film 20 remaining on the CMOS transistor part is then etched away as shown in FIG. 16. The silicon nitride film 12 and the upper portion of the spacer 16 made of silicon nitride are etched away by hot phosphoric acid having a temperature of about 180° C., as shown in FIG. 17. A titanium film having a thickness of about 100 nm is formed on the surface of the semiconductor substrate 1 by spattering.

Figure 18:
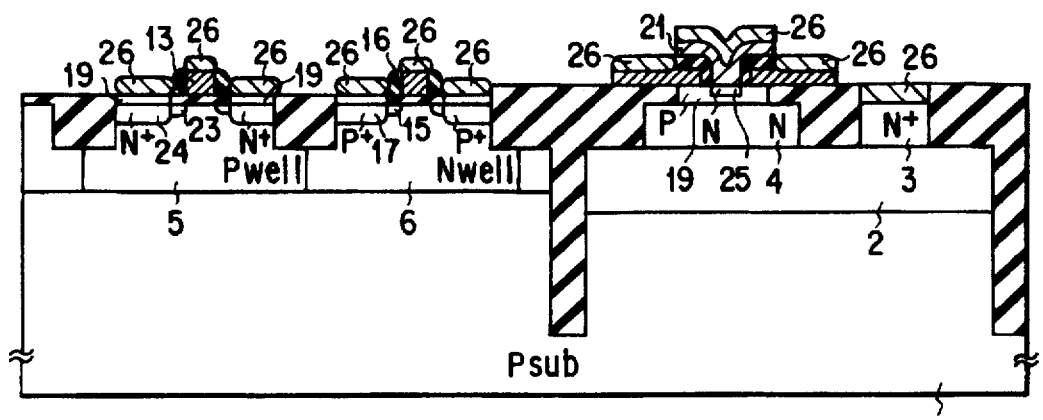
FIG. 18 is a cross-sectional view of a semiconductor device structure in a manufacturing step of the semiconductor device of the present invention shown in FIGS. 1 and 2.

The titanium deposited on the semiconductor substrate is silicified at 650° C. for 30 seconds by RTA. Non-reactive titanium is etched away by a known process (FIG. 18). A further silicidation process to the remaining titanium silicide is performed by RTA at 800° C. for 30 seconds, thereby reducing resistance of respective elements. In this way, the silicide formation process is completed. Titanium silicide films 22 are, thus, formed in a self-aligned manner on the surfaces of the source/drain regions 17 and gate 13 of the NMOS transistor of the CMOS transistor part and the source/drain regions 17 and gate 13 of the PMOS transistor thereof, the emitter electrode 21, base electrode 14 and collector leading N⁺ well 3 of the bipolar transistor part, respectively as shown in FIG. 1.

After treatment is carried out by a known process, and the manufacture of a semiconductor device is completed by an insulating film formation step, a contact hole formation step, a wiring layer formation step, etc.

Figure 19:
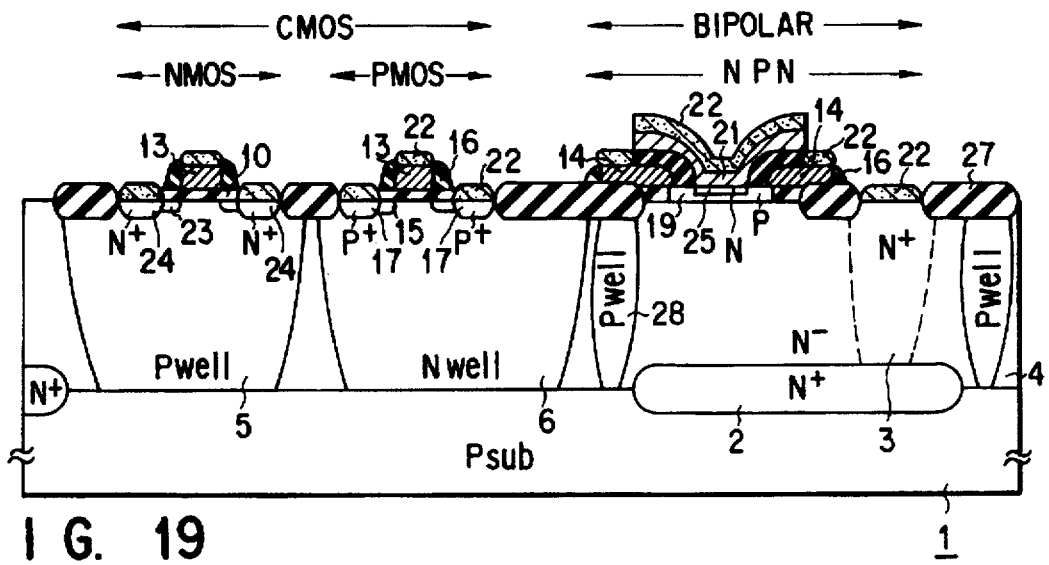
FIG. 19 is a cross-sectional view of the semiconductor device according to a second embodiment of the present invention.
Figure 20:
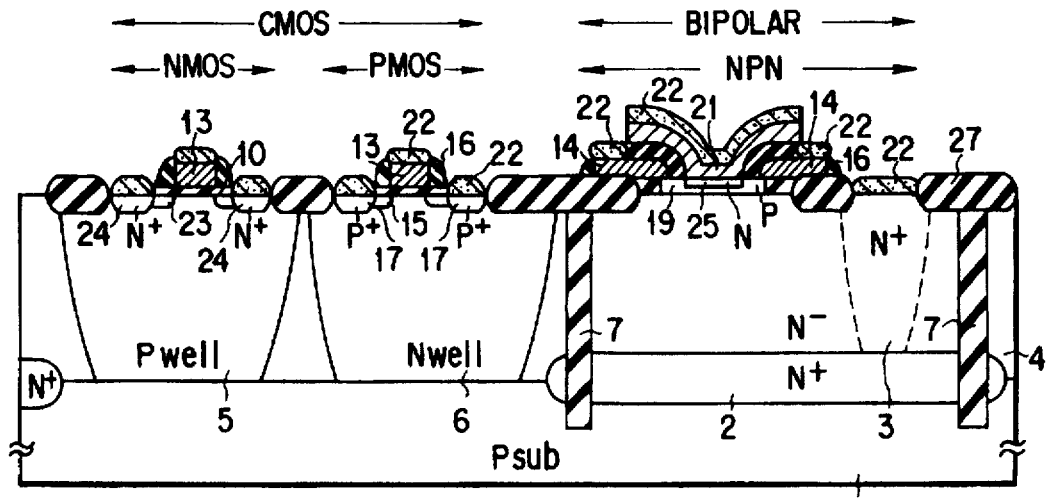
FIG. 20 is a cross-sectional view of the semiconductor device according to a third embodiment of the present invention.

Next, semiconductor devices having a different element separation structure according to the second and third embodiments of the present invention will be described with reference to FIGS. 19 and 20, respectively. FIGS. 19 and 20 are each a cross-sectional view of the semiconductor device of BI-CMOS structure. FIG. 19 illustrates a case of use of LOCOS structure for the element separation. FIG. 20 illustrates also a case of use of LOCOS structure for element separation; however, the bipolar transistor part is surrounded by the DTI separation.

In FIG. 19, an epitaxial wafer comprising a P-type silicon semiconductor substrate 1 and an N-type silicon epitaxial layer (first layer) grown on the semiconductor substrate 1 is used as a semiconductor substrate. An N⁺ buried layer 2 is formed between the P-type silicon semiconductor substrate and N-type silicon epitaxial layer 4 of the bipolar transistor part. A P-type silicon epitaxial film 19, serving as a second layer, is formed on the collector region of the N-type silicon epitaxial layer 4. The P-type epitaxial film 19 constitutes a base region. An N-type ion doped layer constituting an emitter region 25 is formed on the surface region on the main surface of the base region.

The bipolar transistor part is surrounded by a field oxide film 27 of LOCOS structure and a P well 28. A base electrode 14 made of polysilicon is formed on the main surface of the semiconductor substrate. The side wall of the base electrode 14 is isolated and protected by a spacer 16 made of a silicon nitride (Si₃N₄) film. A portion of the main surface is also isolated by the silicon nitride film. An emitter electrode 21 made of polysilicon is formed on the emitter region 25.

In the CMOS transistor part, an NMOS transistor is formed in a P well 5 formed on the N-type epitaxial layer 4 and a PMOS transistor is formed in an N well 6. These well regions of the CMOS transistor part are separated from one another by the field oxide film 27 of LOCOS structure. The NMOS transistor formed in the P well is provided with N⁺ source/drain regions 24 and LDD regions 23. A gate 13 made of polysilicon are formed between the source/drain regions via a gate oxide film 10 on the main surface of the semiconductor substrate 1. A spacer 16 made of silicon nitride (Si₃N₄) film is formed on side wall of the gate. The PMOS transistor formed in the N well 6 is provided with P⁺ source/drain regions 17 and LDD regions 15. A gate 13 made of polysilicon is formed between the source/drain regions via a gate oxide film 10 on the main surface of the semiconductor substrate 1. A spacer 16 made of silicon nitride (Si₃N₄) film is formed on the side wall of the gate.

Metal silicide films 22 made of, for example, Ti silicide are formed on the source/drain regions 17, 24 and gate 13 of the CMOS transistor part and the base electrode 14, collector leading N⁺ well 3 and emitter electrode 21 of the bipolar transistor part, respectively, for the purpose of decreasing resistance of respective elements. The semiconductor device of LOCOS structure according to this embodiment is slower in speed than that of DTI-STI structure.

The semiconductor device shown in FIG. 20 is of a combination of LOCOS and DTI structures. An epitaxial wafer comprising, for example, a P-type silicon semiconductor substrate 1 and an N-type silicon epitaxial layer (first layer) 4 grown on the substrate 1 is used as a semiconductor substrate. An N⁺ buried layer 2 is formed between the P-type silicon semiconductor substrate and N-type silicon epitaxial layer 4 of the bipolar transistor part. A P-type silicon epitaxial film 19, serving as a second layer, is formed on the collector region of the N-type silicon epitaxial layer 4. The P-type epitaxial film 19 constitutes a base region. An emitter region 25 is formed on the surface region of the main surface of the film 19.

The bipolar transistor part is surrounded by DTI 7 and elements of the bipolar transistor part are separated by the field oxide film 27 of LOCOS structure. A base electrode 14 made of polysilicon is formed on the main surface of the semiconductor substrate. The side wall of the base electrode 14 is isolated and protected by the spacer 16 made of the silicon nitride (Si₃N₄) film. A portion of the main surface of the base electrode 14 is also isolated by the silicon nitride film. An emitter electrode 21 made of polysilicon is formed on the emitter region 25.

In the CMOS transistor part, the NMOS transistor is formed in the P well 5 formed on the N-type epitaxial layer 4 and the PMOS transistor is formed in the N well 6. These well regions of the CMOS transistor part are separated from one another by the field oxide film 27 of LOCOS structure. The NMOS transistor formed in the P well is provided with N⁺ source/drain regions 24 and LDD regions 23. A gate 13 made of polysilicon is formed between the source/drain regions 24 via a gate oxide film 10 on the main surface of the semiconductor substrate 1. A spacer 16 made of a silicon nitride (Si₃N₄) film is formed on the side wall of the gate.

The PMOS transistor formed in the N well 6 is provided with P⁺ source/drain regions 17 and LDD regions 15. A gate 13 made of polysilicon is formed between the source/drain regions 17 via a gate oxide film 10 on the main surface of the semiconductor substrate 1. A spacer 16 of a silicon nitride ($Si_3N_4$) film is formed on the side wall of the gate.

Metal silicide films 22 are formed on the source/drain regions 17, 24 and gate 13 of the CMOS transistor part and the base electrode 14, collector leading $N^+$ well 3 and emitter electrode 21 of the bipolar transistor part, respectively, for the purpose of decreasing resistance of respective elements. The semiconductor device of a combination of LOCOS structure and DTI structure according to this embodiment is slower in speed than that of DTI-STI structure but faster than the semiconductor device of use of only LOCOS structure.

Although each of the above-described embodiments uses a P-type semiconductor substrate, it is possible to use an N-type semiconductor substrate. In such a case, the respective N regions or layers should be replaced with P regions or layers.

According to the present invention, in the Bi-CMOS process in which the bipolar transistor having an inner base region made of a silicon film grown by epitaxy and the MOS transistor having silicide layers formed on the gate electrode, source region and drain region in a self-aligned manner therewith are formed on a single semiconductor substrate, while the silicon film constituting the inner base region is epitaxially grown, a silicon film can be easily formed on the source/drain regions grown by epitaxy at the same time in the same step.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A process of manufacturing a semiconductor device comprising the steps of:
    forming a first insulating film in a bipolar transistor formation region of a main surface of a silicon semiconductor substrate;
    forming a second insulating film constituting a gate oxide film in a MOS transistor formation region on the main surface of the silicon semiconductor substrate;
    forming a silicon gate electrode on the gate oxide film of the MOS transistor formation region;
    forming a base electrode made of silicon on the first insulating film in the bipolar transistor formation region;
    coating a side wall and an upper surface of the gate electrode and base electrode with a third insulating film;
    forming source/drain regions in the MOS transistor formation region;
    removing a portion of the first insulating film which is in an emitter region and contacts the lower surface of the base electrode, thereby exposing a portion of the main surface of the semiconductor substrate facing the removed region;
    epitaxially growing a silicon film on the exposed portion on the main surface of the semiconductor substrate and on the source/drain regions, thereby making the silicon film of the exposed portion on the main surface of the semiconductor substrate serving as a base region;
    forming an emitter region by diffusing impurities into the base region;
    forming a silicon emitter electrode on the emitter region;
    depositing a metal layer on the source/drain regions, gate electrode, base electrode and emitter electrode; and
    forming metal silicide in a self-aligned manner with the source/drain regions, gate electrode, base electrode and emitter electrode, by thermal heating the metal layer to react the heated metal layer with silicon of the source/drain regions, gate electrode, base electrode and emitter electrode.

2. The process according to claim 1, wherein the first insulating layer differs from the third insulating film in etching rate.

3. The process according to claim 1, wherein the gate electrode, base electrode and emitter electrode are made of polysilicon.

4. The process according to claim 1, wherein the gate electrode formation and the base electrode formation are carried out in a single step.

5. The process according to claim 1, wherein the first insulating film is made of a silicon oxide film and the third insulating film is made of silicon nitride.

6. The process according to claim 1, wherein, during the step of removing the region of the first insulating film, the region of the first insulating film is etched away by isotropic etching and part of the base electrode on the removed region is overhung.

* * * * *